(12) United States Patent
Hsieh et al.

(10) Patent No.: US 6,667,509 B1
(45) Date of Patent: Dec. 23, 2003

(54) METHOD OF FORMING SHARP BEAK OF POLY BY OXYGEN/FLUORINE IMPLANT TO IMPROVE ERASE SPEED FOR SPLIT-GATE FLASH

(75) Inventors: Chia-Ta Hsieh, Tainan (TW); Yai-Fen Lin, Taichung (TW); Hong-Cheng Sung, Hsin-chu (TW); Di-Son Kuo, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 15 days.

(21) Appl. No.: 09/590,124

(22) Filed: Jun. 9, 2000

Related U.S. Application Data

(62) Division of application No. 09/004,806, filed on Jan. 9, 1998, now Pat. No. 6,093,607.

(51) Int. Cl.[7] ........................ H01L 29/76; H01L 29/788
(52) U.S. Cl. ........................................ 257/316; 257/314
(58) Field of Search ............................... 257/314–324; 438/257–265

(56) References Cited

U.S. PATENT DOCUMENTS

| | | | |
|---|---|---|---|
| 4,740,481 A | 4/1988 | Wilson et al. | 437/24 |
| 5,385,856 A | 1/1995 | Hong | 437/43 |
| 5,401,678 A | 3/1995 | Jeong et al. | 437/44 |
| 5,453,388 A * | 9/1995 | Chen et al. | 438/257 |
| 5,460,983 A | 10/1995 | Hodges et al. | 437/24 |
| 5,479,036 A | 12/1995 | Hong | 257/315 |
| 5,811,853 A * | 9/1998 | Wang | 257/316 |
| 6,188,103 B1 * | 2/2001 | Hsieh et al. | 257/316 |

FOREIGN PATENT DOCUMENTS

| EP | 0 434 121 A1 * | 6/1991 |
|---|---|---|
| JP | 409321157 A * | 12/1997 |

OTHER PUBLICATIONS

S.Wolf, "Silicon Processing For The VLSI Era" vol. 2, Lattice Press, Sunset Beach, CA, 1990, p 438,632,633,634.

* cited by examiner

*Primary Examiner*—Cuong Quang Nguyen
(74) *Attorney, Agent, or Firm*—George O. Saile; Stephen B. Ackerman

(57) ABSTRACT

A method is provided for forming a short and sharp gate bird's beak in order to increase the erase speed of a split-gate flash memory. This is accomplished in two embodiments where in the first, fluorine is implanted in the first polysilicon layer to form the floating gate. It is disclosed here that the implanting of fluorine increases the oxidation rate of the polysilicon and because of the faster oxidation, the polygate bird's beak that is formed attains a relatively short and sharp in comparison with conventional beaks. This has the attendant benefit of forming a relatively small memory cell, and the concomitant reduction in the erase speed of the cell. In the second embodiment, oxygen is used with the same favorable results. A third embodiment discloses the structure of a split-gate flash memory cell having a sharp bird's beak.

6 Claims, 3 Drawing Sheets

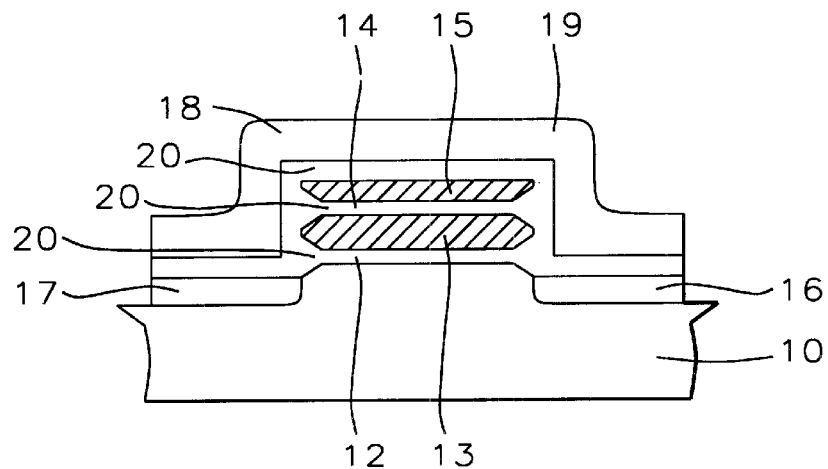
FIG. 1a – Prior Art
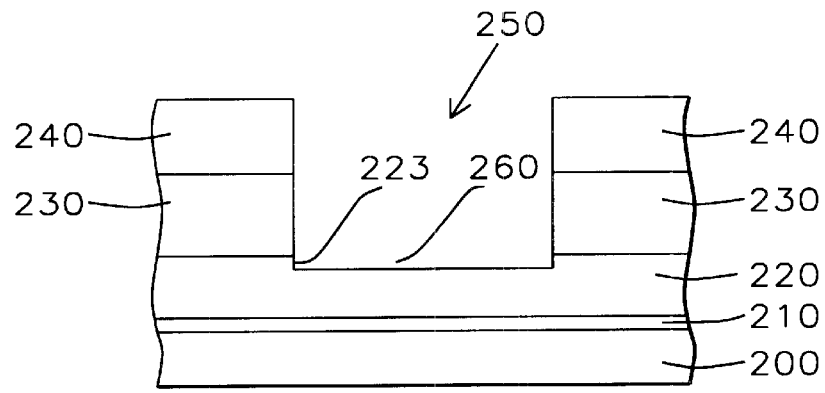
FIG. 1b – Prior Art
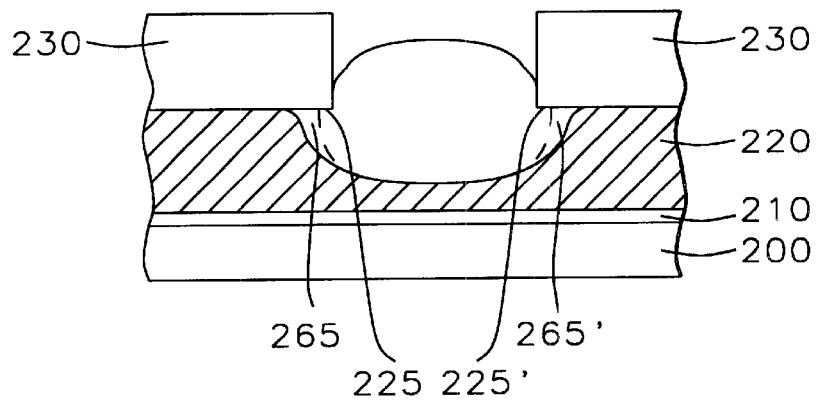
FIG. 1c – Prior Art

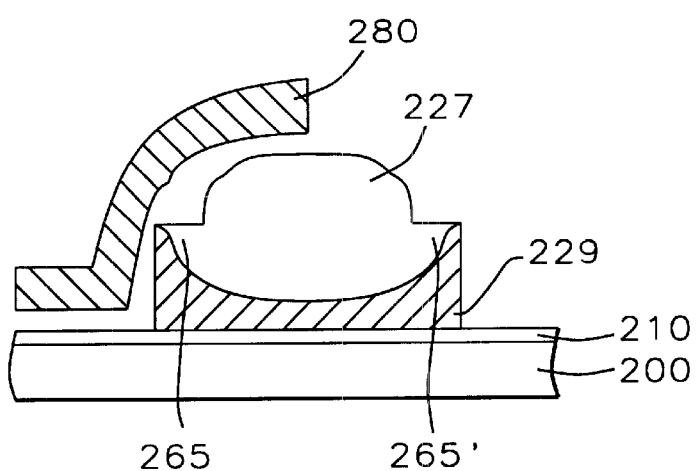
FIG. 1d – Prior Art
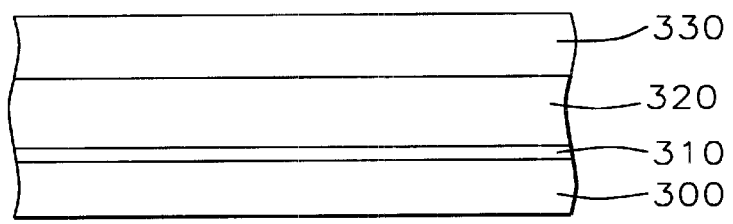
FIG. 2a
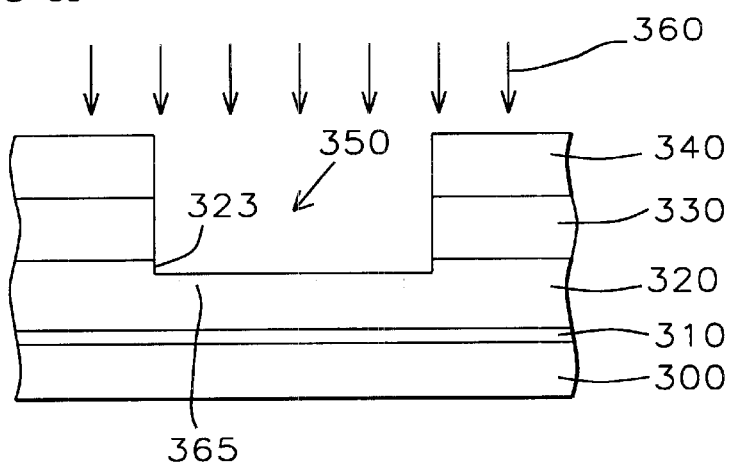
FIG. 2b

METHOD OF FORMING SHARP BEAK OF POLY BY OXYGEN/FLUORINE IMPLANT TO IMPROVE ERASE SPEED FOR SPLIT-GATE FLASH

This is a division of patent application Ser. No. 09/004,806, filing date Jan. 9, 1998, now U.S. Pat. No. 6,093,607 A Method Of Forming Sharp Beak Of Poly By Oxygen/Fluorine Implant To Improve Erase Speed For Split-Gate Flash, assigned to the same assignee as the present invention.

BACKGROUND OF THE INVENTION

(1) Field of the Invention

The present invention relates to split-gate memory cells used in flash EEPROMs (Electrically Erasable Programmable Read Only Memories), and in particular, to a method of forming a sharp beak in the floating gate polysilicon of the same by implanting oxygen/fluorine ions in order to improve the erase speed of the split-gate flash memory.

(2) Description of the Related Art

The size and shape of the areas comprising a memory cell determine to a large extent its functional properties-erase speed being one of the important ones. Thus, the dimensions and shape of the so-called "bird's beak", which is described below more in detail in relation to nonvolatile memories, play an important role in transferring current to and fro between the substrate and the floating gate, and hence the charging speed of the memory cell, and the amount of surface current leakage that takes place around and near the bird's beak.

Among the nonvolatile read only memories, such as masked-ROMs, Electrically Programmable (EP-ROMs), EEPROMs have been known as one type of nonvolatile memory semiconductor devices capable of electrically writing and erasing information. However, EEPROMs require two transistors to operate. In Flash EEPROM, the memory cell includes one transistor, and the contents of all the memory's cells can be erased simultaneously through the use of an electrical erase signal. Hence, with Flash memory, in addition to gaining speed in having the cells erased much more rapidly, higher levels of integration can be achieved with fewer devices.

The unit cell of an EEPROM memory device is usually comprised of a silicon substrate provided with a source and a drain, and two polysilicon gates; that is, a MOS transistor having a channel defined by the source and drain regions, a floating gate to which there is no direct electrical connection and a control gate with a direct electrical connection. The floating gate is separated from the substrate by an insulating layer of, for example, silicon oxide. The control gate is generally positioned over the floating gate with a layer of insulating material separating the two gates. To program a transistor, charge is transferred from the substrate through the insulator and is stored on the floating gate of the transistor. The amount of charge is set to one of two levels to indicate whether the cell has been programmed "on" or "off." "Reading" of the cell—s state is accomplished by applying appropriate voltages to the cell source and drain, and to the control gate, and then sensing the amount of charge on the floating gate. To erase the contents of a cell, the programming process is reversed, namely, charges are removed from the floating gate by transferring them back to the substrate through the insulator. A fairly recent technology is "flash" memories in which the entire array of memory cells, or a significant subset thereof, is erased simultaneously. Flash EEPROMs combine the advantages of UV-erasable EPROMS and floating-gate EEPROMs. They offer high density, small cell size, the well-known hot-electron writability of EPROMs, together with the easy reusability, on-board reprogrammability, and electron-tunneling erasure feature of EEPROMs (See S. Wolf, "Silicon Processing for the VLSI Era," vol. 2, Lattice Press, Sunset Beach, Calif., 1990, pp. 632–634.)

Programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

A cross section of a conventional Flash EEPROM is shown in FIG. 1. Drain impurity diffusion layer (16) and a source impurity diffusion layer (17) are formed on a main surface of the semiconductor substrate (10) and are spaced from each other by a predetermined distance with a channel region therebetween. The conventional Flash EEPROM further includes a floating gate electrode (13) formed on the channel region with a first gate oxide film (12) therebetween, a control gate electrode (15) formed on the floating gate electrode (13) with an insulating film (14) therebetween, an interlayer thermal oxide film (18) covering the semiconductor substrate (10), floating gate electrode (13) and control gate electrode (15), and an interlayer insulating film (19) covering the interlayer thermal oxide film (18). Gate bird's beak oxide films (20) are formed at opposite ends of the first gate oxide film (12) and opposite end of the insulating film (14). The interlayer insulating film (19) contains impurity such as boron or phosphorous. The purpose of the interlayer thermal oxide film (18) is to prevent the movement of impurity such as boron of phosphorous of the interlayer insulating film (19) into the semiconductor substrate (10), control gate electrode (15) or floating gate electrode (13) and thus to prevent change of the electrical characteristics thereof.

After the final step of forming the interlayer insulating film (19) to cover the interlayer thermal oxide film (18) shown in FIG. 1, usually heat treatment by a reflow method is carried out to flatten the interlayer insulating film (19). During this process as well as during thermally growing the thermal oxide layer (18) by means of wet oxidation, oxidizer ($H_2O$) penetrates the interlayer insulating film (19) and interlayer thermal oxide film (18). This causes further oxidization between the semiconductor substrate (10) and the ends of the floating gate electrode (13), and between the control gate electrode (15) and the floating gate electrode (13). As a result, the gate bird's beak oxide films (20) are formed. Consequently, the lower end of the floating gate electrode (13) contacts the gate bird's beak oxide films (20) so that the lower end of the floating gate electrode (13) is oxidized to a large extent as compared with the other portions.

The gate bird's beak oxide film (20) can form either at the lower end of the floating gate (13) and the source impurity diffusion layer (17), or at the lower end of the floating gate near the drain impurity diffusion layer (16), or at both locations. In these cases, the conventional "beak" of the bird's beak is usually long and elongated, thus increasing the size of the cell and at the same time providing paths for current leakage and, therefore, low memory speed.

The formation of a conventional bird's beak in a polysilicon gate is better shown in FIGS. 1b and 1c. In FIG. 1b, layers of gate oxide (210), polysilicon (220) and nitride (230) are successively formed on substrate (200) and then patterned with a photomask layer (240) to define the floating polygate region (260). Subsequently, polysilicon layer (220) is oxidized whereby gate bird beaks (265) and (265') are formed as well known in the art. It is proposed in this invention a method of implanting the polysilicon so as to decrease the growth of the protrusion of gate bird's beak as shown by reference numerals (265) and (265') in FIG. 1c to a smaller size and sharper shape shown by reference numerals (225) and (225'). It will be known by those skilled in the art that the smaller the birds' beak, the smaller is the encroachment under the polysilicon edge, and hence the smaller is the impact on the electric-field intensity between the corner edge of the floating gate (229) and the control gate (280) of the completed cell structure shown in FIG. 1d, and thus faster is the memory speed. (See S. Wolf and R. N. Tauber, "Silicon Processing for the VLSI Era," vol. 2, Lattice Press, Sunset Beach, Calif., 1990, p. 438). It will also be appreciated that the smaller the bird's beak, the smaller is the overall size of the memory cell contributing to the increased speed of the memory.

Related art teaches methods of forming split-gate memories with bird's beaks in different ways. Jeona, et al., disclose in U.S. Pat. No. 5,401,678 a method of fabricating a transistor with a bird's beak of predetermined size. Hong, et al., teach in U.S. Pat. Nos. 5,385,856 and 5,479,036, a method of manufacturing fieldless split-gate Flash EPROM in which there is no field oxidation process, and therefore, no bird's beak. Hodges, et al., on the other hand, show in U.S. Pat. No. 5,460,983 a method for forming isolated intra-polycrystalline silicon structures by implanting oxygen or nitrogen while Wilson, et al., disclosed in U.S. Pat. No. 4,740,481 a method of preventing hillock formation in polysilicon layer by oxygen implantation. However, this invention teaches a method of shaping polysilicon bird's beak in flash split-gate memories through implanting oxygen or fluorine ions in order to reduce current leakage and improve memory speed.

SUMMARY OF THE INVENTION

It is therefore an object of this invention to provide a split-gate memory cell with a sharp polygate bird's beak.

It is another object of this invention to provide a method of implanting oxygen or fluorine into the polygate of a split-gate memory cell.

It is yet another object of this invention to provide a method of reducing leakage current and increasing the speed of a split-gate memory cell.

These objects are accomplished by providing a method for forming a gate oxide layer over a semiconductor substrate; forming a first polysilicon layer over said gate oxide layer; forming a nitride layer over said first polysilicon layer; forming a photoresist layer over said nitride layer; patterning said photoresist layer, said nitride layer to define a floating polygate region in said first polysilicon layer; performing an implant of impurity in said floating gate region; removing said photoresist layer; oxidizing said first polysilicon layer; forming impurity concentration at the polygate edge to reduce surface leakage current; removing said nitride layer; etching said first polysilicon layer; forming an oxide layer over said first polysilicon layer; forming a second polysilicon layer over said oxide layer; and patterning said second polysilicon layer to form a control gate. These objects are accomplished in two embodiments where fin the first embodiment fluorine is used as the implant and oxygen in the second embodiment.

In a third embodiment, objects of the present inventions are further accomplished by providing a split-gate flash memory with a sharp polygate bird's beak comprising a semiconductor substrate of a first conductivity type having separated first and second regions of a second conductivity type formed therein, the first and second regions defining a substrate channel region therebetween; a doubly implanted floating gate separated from a doped region in the substrate by an oxide layer; a control gate partially overlying and separated by an insulator from said floating gate having a sharp and short portion to reduce surface leakage current and improve erase speed of the memory cell.

BRIEF DESCRIPTION OF THE DRAWINGS

FIG. 1a is a partial cross-sectional view of a Flash EEPROM of prior art.

FIG. 1b is a partial cross-sectional view of a semiconductor substrate showing the patterning of a first polysilicon layer, and nitride layer to form a floating gate according to prior art.

FIG. 1c is a partial cross-sectional view of a semiconductor substrate showing the forming of large gate bird's beak of prior art.

FIG. 1d is a partial cross-sectional view of a semiconductor substrate showing the forming of a completed memory cell having a large gate bird beak of prior art.

FIG. 2a is a partial cross-sectional view of a semiconductor substrate showing the deposition of gate oxide, polycrystalline silicon and nitride layers according to this invention.

FIG. 2b is a partial cross-sectional view of the substrate of FIG. 2a showing the implanting of the floating gate area according to this invention.

DESCRIPTION OF THE PREFERRED EMBODIMENTS

Figure 2C:
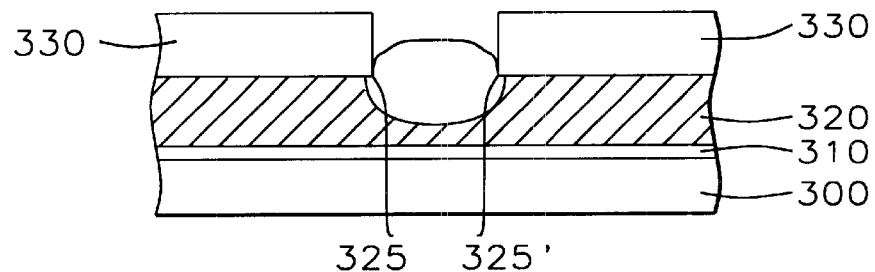
FIG. 2c is a partial cross-sectional view of a semiconductor substrate showing the forming of a small gate bird's beak according to this invention.

Referring now to the drawings, in particular to FIGS. 2a–2e, there are shown schematically steps of forming a split-gate flash memory with a sharp and short gate bird's beak which substantially improves the erase speed of the memory cell.

In FIG. 2a, substrate (300), preferably silicon, is provided with gate oxide (310) of a thickness between about 70 to 90 angstroms (Å). A first polycrystalline silicon (polysilicon) layer (320) is deposited over the gate oxide followed by the deposition of a silicon nitride layer (330) as shown in FIG. 2a. It is preferred that the polysilicon layer has a thickness between about 1000 to 1200 Å, and that the nitride layer is deposited to a thickness between about 700 to 800 Å.

Next, a photoresist layer (340) is first spun on the substrate and then patterned, and nitride layer (330) is etched using a recipe comprising gases $SF_6$ and $O_2$, thus defining a floating gate area. Using the patterned photoresist and nitride layers as a mask (350), and as a main feature of the invention, an implantation of fluorine (360) into the first polysilicon layer is performed with a concentration between about $1\times10^{15}$ to $1\times10^8$ atoms/cm$^2$ at an energy level between about 70 to 80 KEV. The fluorine ions are then diffused into a depth of between about 150 to 500 Å in region (365) as shown in FIG. 2b. In a second embodiment, oxygen is used to implant with the same concentration between about $1\times10^{15}$ to $1\times10^{18}$ atoms/cm$^2$ at the same energy level between about 70 to 80 KEV.

The key aspect of this main step of implanting fluorine or oxygen is that the implant ions that diffuse into to upper regions of the first polysilicon layer (320) increase the rate of oxidation of the polysilicon when subjected to still another important step of oxidation after the removal of photoresist layer (340). It will first be observed that as a result of nitride etching, a shallow ledge (323) is formed into polysilicon layer (320) as shown in FIG. 2b. When oxidation is performed, preferably wet and at a temperature between about 850° C. to 900° C., polyoxide starts to form and grow into opening (350) as shown in FIG. 2c. The growth of the polyoxide is usually nonuniform with a somewhat oval shape having thin and thick portions as shown in the same Figure. The nonuniform growth is further enhanced by the presence of fluorine or oxygen ions in region (365). That is, the oxidation rate is much faster in region (365) than elsewhere in polysilicon layer (320). Consequently, when gate bird's beak (325) starts forming under polysilicon ledge (323), because of the faster oxidation rate it forms quickly without the opportunity to grow to the normal, conventional size.

The importance of implanting the polysilicon layer prior to oxidizing it becomes clearer when FIG. 2c of this invention is compared with FIG. 1c of prior art. In the absence of implanted ions in the polysilicon layer (220) of FIG. 1b, the oxidation rate is relatively slow so that a relatively a longer oxidation time permits the formation of a relatively large gate bird's beak (265), of prior art. In comparison, beak (325) of FIG. 2c is much smaller.

Figure 2D:
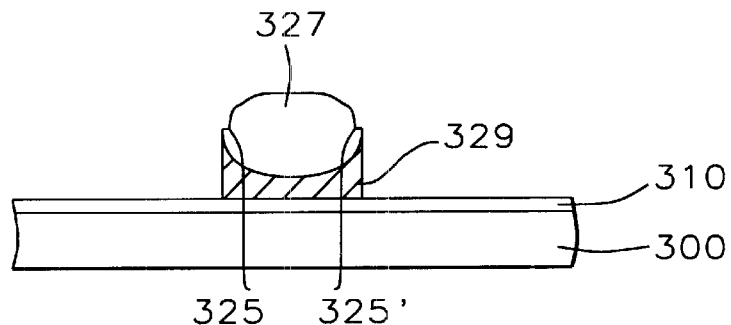
FIG. 2d is a partial cross-sectional view of the substrate of FIG. 2c showing the forming of the floating gate of this invention.

After the thermal growth of polysilicon oxide (polyoxide) (327) and the forming of a relatively small and sharp gate bird's beak (325) according to this invention shown in FIG. 2c, nitride layer (330) is removed and first polysilicon layer (320) is etched using the oval shaped polyoxide (327) as a mask. Thus, a floating gate (329) is formed as shown in FIG. 2d. It is preferred that the etching recipe comprises gases HBr, $Cl_2$, He and $O^2$. An oxide layer (370) and a second polysilicon layer (380) are subsequently formed and patterned as shown in FIG. 2e, where the preferred thicknesses are, respectively, between about 200 to 300 Å, and 2000 to 2500 Å.

Figure 2E:
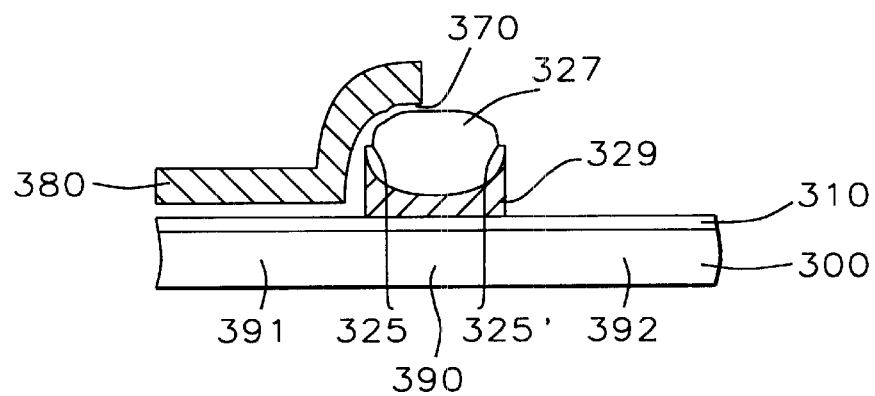
FIG. 2e is a partial cross-sectional view of the substrate of FIG. 2d showing the forming of a control gate for the completed split-gate memory cell of this invention.

The resulting structure of FIG. 2e, with gate oxide (310), floating gate (329), control gate (380), channel (390), source (197) and drain (199) completes the enhanced split-gate flash memory of this invention.

In operation, in the erase mode, for example, the drain electrode of the drain impurity diffusion layer (391) is set in the floating state, and the control gate electrode (380) is set in the grounded state. A high voltage of about 12 volts is applied to a source electrode formed of the source impurity diffusion layer (392). Thereby, a Fowler-Nordheim tunnel current flows from the source impurity diffusion layer (392) to the floating gate electrode (327) through the edge of the gate oxide located under the end of the floating gate electrode (329) near the source impurity diffusion region (392). This Fowler-Fordheim tunnel current is used to draw the electrons from the floating gate electrode (329), whereby the information is erased. The closer coupling between floating gate (329) and control gate (380) through smaller and sharp gate bird's beak (325) renders the erasing operation to be performed in a much faster mode. In other words, the local electric field is enhanced with the sharp beak of polygate so that the erase speed becomes faster.

While the invention has been particularly shown and described with reference to the preferred embodiments thereof, it will be understood by those skilled in the art that various changes in form and details may be made without departing from the spirit and scope of the invention.

What is claimed is:

1. A sharp split-gate flash memory comprising:

a semiconductor substrate;

a floating gate separated from a channel area in the substrate by an oxide layer;

said floating gate having a peripheral region and a recessed central region, said recessed central region deep implanted with impurity ions, said peripheral region absent of said impurity ions, wherein said impurity ions comprise fluorine;

a polyoxide layer formed over said floating gate;

said polyoxide layer having a short bird's beak shape formed over said peripheral region of said floating gate absent of said impurity ions and having a thicker convex shape over said central region of said floating gate containing said impurity ions, said thicker convex shape resulting from said impurity ions, said short birds beak shape resulting from the absence of said impurity ions;

a control gate partially overlying and separated by said polyoxide layer and an insulator from said floating gate.

2. The sharp split-gate flash memory of claim 1, wherein said floating gate and said control gate comprise polycrystalline silicon.

3. The sharp split-gate flash memory of claim 1, wherein said impurity ions are implanted at a depth of between 150 Å to 500 Å below an initial surface of said central region prior to the formation of the polyoxide layer, said implantation accomplished at an energy level between 70 to 80 Kev.

4. A sharp split-gate flash memory comprising:

a semiconductor substrate;

a floating gate separated from a channel area in the substrate by an oxide layer;

said floating gate having a peripheral region and a recessed central region, said recessed central region deep implanted with impurity ions, said peripheral region absent of said impurity ions, wherein said impurity ions comprise oxygen;

a polyoxide layer formed over said floating gate;

said polyoxide layer having a short bird's beak shape formed over said peripheral region of said floating gate absent of said impurity ions and having a thicker convex shape over said central region of said floating gate containing said impurity ions, said thicker convex shape resulting from said impurity ions, said short birds beak shape resulting from the absence of said impurity ions;

a control gate partially overlying and separated by said polyoxide layer and an insulator from said floating gate.

5. The sharp split-gate flash memory of claim 4, wherein said floating gate and said control gate comprise polycrystalline silicon.

6. The sharp split-gate flash memory of claim 4, wherein said impurity ions are implanted at a depth of between 150 Å to 500 Å below an initial surface of said central region prior to the formation of the polyoxide layer, said implantaton accomplished at an energy level between 70 to 80 Kev.

* * * * *